United States Patent
Courtney et al.

(10) Patent No.: US 10,979,041 B1
(45) Date of Patent: Apr. 13, 2021

(54) METHOD FOR MONITORING GATE DRIVE SIGNALS FOR POWER MODULE AGING EFFECTS

(71) Applicant: Hamilton Sundstrand Corporation, Charlotte, NC (US)

(72) Inventors: Christopher J. Courtney, Janesville, WI (US); Gary L. Miles, Stillman Valley, IL (US)

(73) Assignee: HAMILTON SUNSTRAND CORPORATION, Charlotte, NC (US)

( * ) Notice: Subject to any disclaimer, the term of this patent is extended or adjusted under 35 U.S.C. 154(b) by 0 days.

(21) Appl. No.: 16/818,392

(22) Filed: Mar. 13, 2020

(51) Int. Cl.
| | | |
|---|---|---|
| *G01R 23/02* | (2006.01) |
| *G01R 31/02* | (2006.01) |
| *G01R 31/28* | (2006.01) |
| *G01R 31/317* | (2006.01) |
| *H03K 17/081* | (2006.01) |
| *G01R 31/26* | (2020.01) |

(52) U.S. Cl.
CPC ... *H03K 17/08116* (2013.01); *G01R 31/2601* (2013.01); *G01R 31/2607* (2013.01); *G01R 31/2642* (2013.01)

(58) Field of Classification Search
CPC .......... H03K 17/08116; G01R 31/2601; G01R 31/2607; G01R 31/2642
See application file for complete search history.

(56) References Cited

U.S. PATENT DOCUMENTS

| | | | |
|---|---|---|---|
| 10,369,887 B2* | 8/2019 | Garcha | B60L 1/02 |
| 10,431,983 B2* | 10/2019 | Wang | H02M 1/42 |
| 2010/0194400 A1* | 8/2010 | Baumann | G01R 31/3016 |
| | | | 324/537 |
| 2011/0101990 A1* | 5/2011 | Noorlag | G11C 29/025 |
| | | | 324/537 |
| 2013/0285685 A1* | 10/2013 | Bowman | G06F 1/10 |
| | | | 324/750.3 |
| 2014/0306687 A1* | 10/2014 | Ahmadi | G01R 31/31727 |
| | | | 324/76.11 |

* cited by examiner

*Primary Examiner* — Kenneth B Wells
(74) *Attorney, Agent, or Firm* — Cantor Colburn LLP

(57) ABSTRACT

A system is provided. The system includes a semi-conductor device and a gate drive board. The gate drive board provides a voltage to the semi-conductor device. The system also includes a controller and a monitoring circuit. The controller drives the voltage provided by the gate drive board. The monitoring circuit is coupled to the gate drive board to monitor operations of the controller and the semi-conductor device.

16 Claims, 3 Drawing Sheets

METHOD FOR MONITORING GATE DRIVE SIGNALS FOR POWER MODULE AGING EFFECTS

BACKGROUND

Exemplary embodiments pertain to monitoring gate drive signals for power module aging effects.

In general, semi-conductor devices (e.g., power modules) used in modern power electronics age over time. Examples of power modules include, but are not limited to, insulated-gate bipolar transistors (IGBTs) and metal-oxide-semiconductor field-effect transistors (MOSFETs). An example of a modern power electronic can be a controller with a gate drive board driving a semi-conductor device.

Aging over time can be categorized as thermal cycling and power cycling. Aging over time can also be categorized to include wire bonds breaking and lift-off of a die from a substrate. Eventually, aging over time in the semi-conductor devices will cause it to fail.

Currently, with respect to the controller and the semi-conductor device therein, nothing is on the gate drive board to monitor changes with respect to aging to alert a user that the semi-conductor device is nearing its end of life. At best, a current sensor can be used for control and monitoring current through the semi-conductor device within the controller; however, this current sensor does not provide the resolution required to see such changes. Thus, there is currently no prognostic health monitoring of the semi-conductor devices for aging effects, which could be used to determine when the product is nearing end of life.

BRIEF DESCRIPTION

In accordance with one or more embodiments, a system is provided. The system includes a semi-conductor device and a gate drive board. The gate drive board provides a voltage to the semi-conductor device. The system also includes a controller and a monitoring circuit. The controller drives the voltage provided by the gate drive board. The monitoring circuit is coupled to the gate drive board to monitor operations of the controller and the semi-conductor device.

In accordance with one or more embodiments or the system embodiment above, the controller can enable operations of the system in a degraded mode or fail operational mode based on one or more critical signals received by the monitoring circuit.

In accordance with one or more embodiments or any of the system embodiments above, the gate drive board can provide a gateway to one or more critical signals that are used by the monitoring circuit to monitor the operations.

In accordance with one or more embodiments or any of the system embodiments above, the gate drive board can turn on and off the semi-conductor device via the voltage.

In accordance with one or more embodiments or any of the system embodiments above, the monitoring circuit can be coupled to the gate drive board to monitor operations of the controller and a charge current of the semi-conductor device.

In accordance with one or more embodiments or any of the system embodiments above, the monitoring circuit can record the voltage with respect to the operations over time as prognostic data.

In accordance with one or more embodiments or any of the system embodiments above, the prognostic data can include data for predicting time at which the system, the controller, or the semi-conductor device will fail.

In accordance with one or more embodiments or any of the system embodiments above, the system can be in communication with a central maintenance computer that reports out data via notifications to other systems or users.

In accordance with one or more embodiments, a method is provided. The method includes driving, by a controller connected to a gate drive board, a voltage of the gate drive board and providing, by the gate drive board, the voltage to a semi-conductor device. The method also includes monitoring, by a monitoring circuit coupled to the gate drive board, operations of the controller and the semi-conductor device.

In accordance with one or more embodiments or the method embodiment above, the controller can enable operations of the system in a degraded mode or fail operational mode based on one or more critical signals received by the monitoring circuit.

In accordance with one or more embodiments or any of the method embodiments above, the gate drive board can provide a gateway to one or more critical signals that are used by the monitoring circuit to monitor the operations.

In accordance with one or more embodiments or any of the method embodiments above, the gate drive board can turn on and off the semi-conductor device via the voltage.

In accordance with one or more embodiments or any of the method embodiments above, the monitoring circuit can be coupled to the gate drive board to monitor operations of the controller and a charge current of the semi-conductor device.

In accordance with one or more embodiments or any of the method embodiments above, the monitoring circuit can record the voltage with respect to the operations over time as prognostic data.

In accordance with one or more embodiments or any of the method embodiments above, the prognostic data can include data for predicting time at which the system, the controller, or the semi-conductor device will fail.

In accordance with one or more embodiments or any of the method embodiments above, the system can be in communication with a central maintenance computer that reports out data via notifications to other systems or users.

BRIEF DESCRIPTION OF THE DRAWINGS

The following descriptions should not be considered limiting in any way. With reference to the accompanying drawings, like elements are numbered alike.

DETAILED DESCRIPTION

A detailed description of one or more embodiments of the disclosed apparatus and method are presented herein by way of exemplification and not limitation with reference to the Figures.

Figure 1:
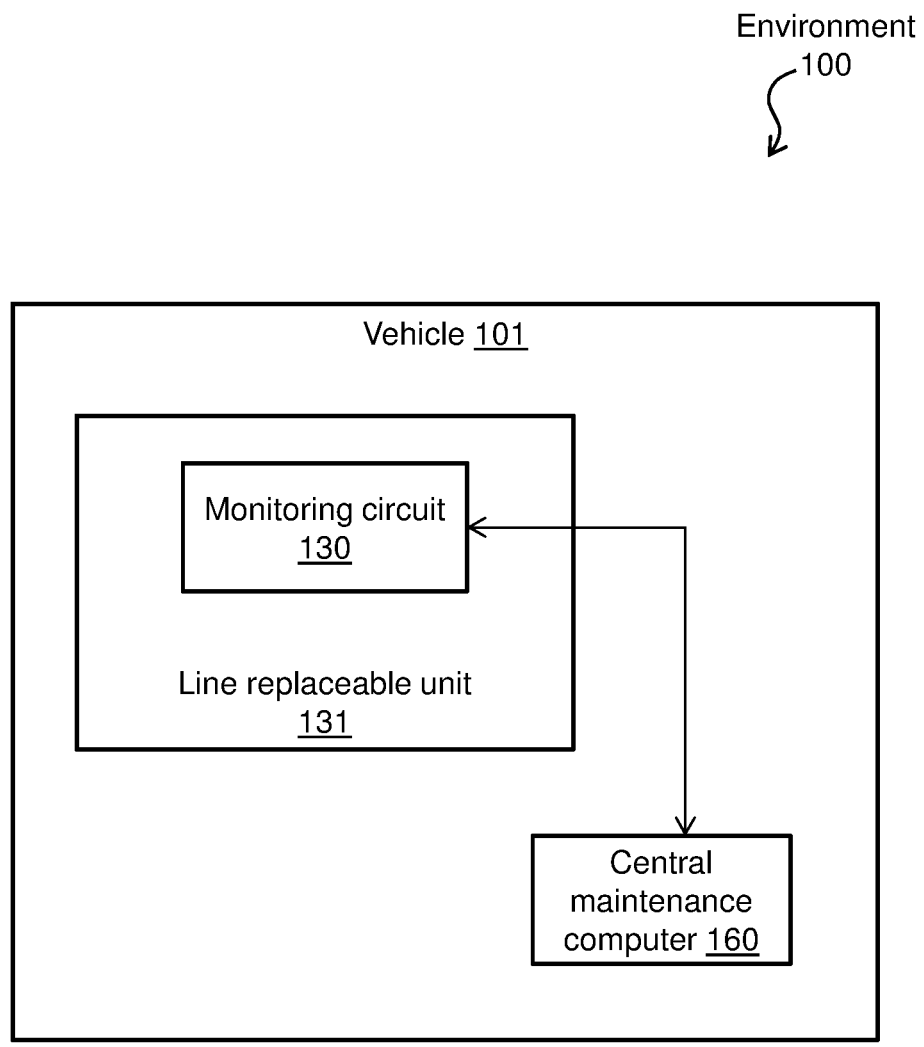
FIG. 1 depicts an environment in accordance with one or more embodiments.

FIG. 1 depicts an environment 100 in accordance with one or more embodiments. The environment 100 includes at least a vehicle 101, a monitoring circuit 130, one or more line replaceable units (LRUs) 131, and a central maintenance computer 160. The vehicle 101 can be any vehicle, such as an aircraft, a truck, a car, an electric automobile, and the like. In accordance with one or more embodiments, as shown in FIG. 1, the monitoring circuit 130 can be included in the one or more line replaceable units (LRUs) 131, which is further within the vehicle 101. Further, the central maintenance computer 160 can also be located within the vehicle 101.

The central maintenance computer 160 can be an electronic, computer framework comprising and/or employing any number and combination of computing device and networks utilizing various communication technologies, as described herein. The central maintenance computer 160 can be easily scalable, extensible, and modular, with the ability to change to different services or reconfigure some features independently of others. The central maintenance computer 160 can include a processor, which can include one or more central processing units (CPUs). The processor, also referred to as a processing circuit, microprocessor, computing unit, is coupled via a system bus to a system memory (e.g., for storing prognostic data and/or program code thereon) and various other components. In an example operation, the central maintenance computer 160 can report out data via notifications to other systems and/or users. In addition, the monitoring circuit 130 and/or the central maintenance computer 160 can also report out data by other mechanisms, such as wireless configurations.

The monitoring circuit 130 of the vehicle 101, as an example, captures and reports prognostic data of the vehicle 101 and the LRUs 131 to the central maintenance computer 160. More particularly, for example, the monitoring circuit 130 being inside the LRU 131 reports out of the LRU 131 to the central maintenance computer 160, which is located inside the vehicle 101. The prognostic data or prognostic health data includes data that can be used for predicting time at which a system or a component (e.g., a semi-conductor device) will no longer perform its intended function. The LRUs 131 is representative of one or more modular components of the vehicle 101 that is designed to be replaced ("quickly") at an operating location.

In accordance with one or more embodiments, the prognostic data can be stored in a memory of the monitoring circuit 130 until the prognostic data is ready (e.g., when an aircraft lands or is up for service and maintenance) to be read by some other device. Further, if the monitoring circuit 130 is part of a more critical piece of equipment on the vehicle 101, then the monitoring circuit 130 can report up to a central computer on the vehicle 101 to identify that the LRU 131 needs to be replaced soon. The monitoring circuit 130 is further described with respect to FIG. 2.

Figure 2:
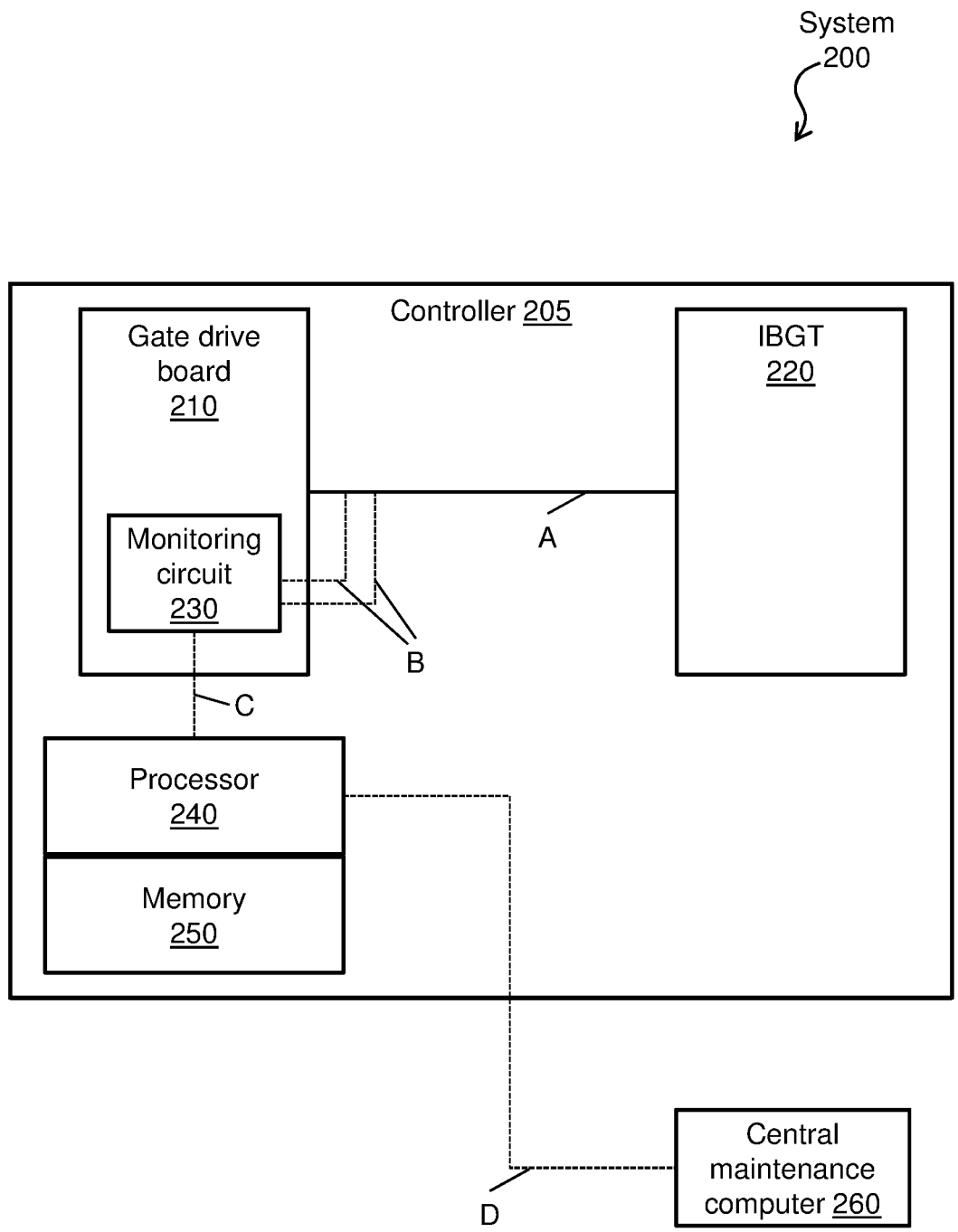
FIG. 2 depicts a system in accordance with one or more embodiments.

FIG. 2 depicts a system 200 in accordance with one or more embodiments. The system 200 includes a controller 205, a gate drive board 210, an insulated-gate bipolar transistor (IGBT) 220 (which is representative of one or more semi-conductor devices or power modules/devices, such as a metal-oxide-semiconductor field-effect transistor (MOSFET), and not limited to IGBTs), a monitoring circuit 230 (which is representative of the monitoring circuit 130 of FIG. 1), a processor 240, a memory 250, and a central maintenance computer 260 (which is representative of the central maintenance computer 160). In general, the system 200 enables a turn-on voltage and a charge current to be monitored during operation of semi-conductor devices (e.g., IGBTs). While recording these signals (e.g., the turn-on voltage and the charge current) over time, the monitoring circuit 230 can be used to determine when the IGBT 220 (e.g., LRU 130 of system 100) needs to be replaced before a failure occurs.

The controller 205 is a computer device, circuit, and/or processor that handles/manages signals of the system 200 (e.g., driving a voltage provided by the gate drive board 210). The controller 205 can be connected to the system 200 via a plug and socket and is capable of handling/managing incoming and outgoing analog and/or control digital signals.

The gate drive board 210 can be any power amplifier that accepts an input (e.g., signals) from the controller 205 and produces a high-current drive input for the IGBT 220. For example, the gate drive board 210 serves as the interface between control signals (e.g., the controller 205) and power switches (e.g., the IGBT 220), such as by providing a voltage to the IGBT 220.

The IGBT 220 is a power semiconductor device primarily used as an electronic switch to combine efficiency and fast switching.

The monitoring circuit 230 includes one or more circuits that receive, store, and manage one or more monitoring signals (e.g., one or more critical signals). Note that the monitoring circuit 230 has been added to the gate drive board 210 to monitor the controller 205 and the IGBT 220. More particularly, the gate drive board 210, which is used to turn on and off IGBT 220, provides a gateway to one or more critical signals that are used by the monitoring circuit 230 to monitor IGBT 220.

The processor 240 can be any processing circuit, microprocessor, or computing unit (that can further include one or more central processing units (CPUs), etc.) that is coupled to the memory 250 and various other components of the system 200.

The memory 250 can be any device that is used to store information for immediate use in a computer or related computer hardware device. The memory 250 can include nonvolatile memory, which is used to store data (e.g., prognostic data) over time that can be read and/or until it can be read by either the central maintenance computer 160 or another device (e.g., a device remote to the vehicle 101) The memory 250 can include read only memory (ROM) and random access memory (RAM).

The central maintenance computer 260 can be any electronic, computer framework comprising and/or employing any number and combination of computing devices and networks utilizing various communication technologies, as described herein. The central maintenance computer 260 can be easily scalable, extensible, and modular, with the ability to change to different services or reconfigure some features independently of others.

Figure 3:
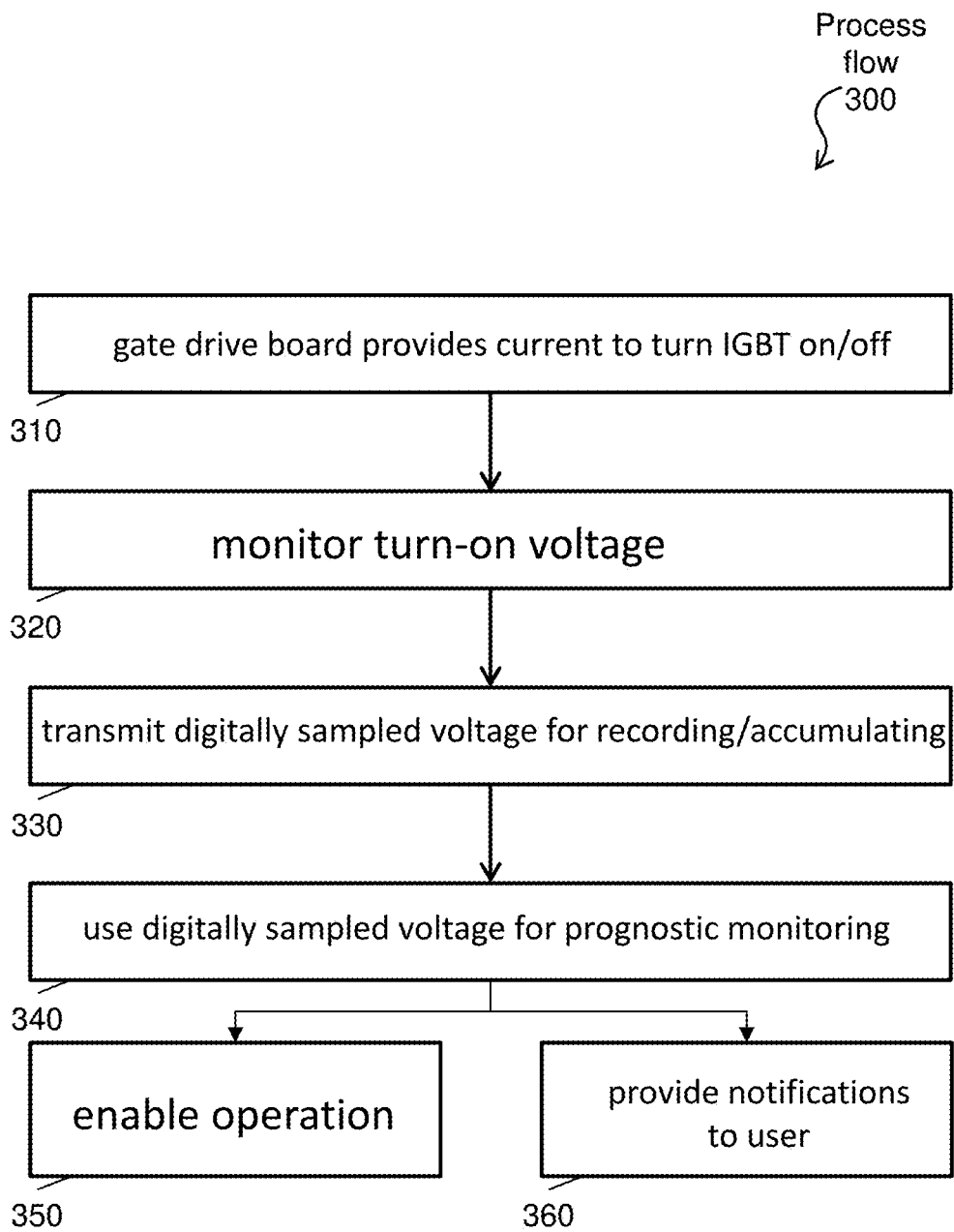
FIG. 3 depicts a process flow in accordance with one or more embodiments.

FIG. 3 depicts a process flow 300 as an example operation of the system 200 of FIG. 2, in accordance with one or more embodiments. The process flow 300 begins are block 310, where the gate drive board 210, used to control the IGBT 220, has access to the turn-on voltage of the IGBT 220 as well as a potential source to monitor the charge current, used to activate a gate of the IGBT 220 (as depicted by Line A of FIG. 2). The gate drive board 210 takes an isolated command signal (from the controller 205) and provides enough current to charge/discharge the Miller capacitance (e.g., effective multiplication of a plate-to-grid capacitance) in the gate of the IGBT 220, thereby turning the IGBT 220 on/off.

At block 320, the turn-on voltage can be monitored by the monitoring circuit 230 (as depicted by Lines B of FIG. 2). In this regard, the monitoring circuit 230 detects one or more monitoring signals (e.g., representing voltage) that can characterize aging of the IGBT 220. For example, the turn-on voltage by the monitoring circuit 230 is monitored for desaturation protection. The voltage seen/captured during a turn-on period can be latched in an analog circuit of the monitoring circuit 230. The momentarily captured turn-on voltage can then be sensed by an isolated analog to digital converter (ADC), such as a sigma-delta ADC.

Note that desaturation protection is performed by monitoring a voltage from a gate to an emitter of the IGBT 220 in accordance with one or more embodiments. In this regard, during a normal turn-on condition, this voltage goes below a few volts in a matter of a few microseconds. If the IGBT 220 is trying to turn on and there is too much current going through it (e.g., during a shoot-through event), then the voltage doesn't get low enough in those first few microseconds. A desaturation protection circuit is monitoring this voltage and uses that information to quickly stop the IGBT 220 from attempting to turn on and thus stop it from potentially damaging itself due to an over current event. In some cases, because this voltage is already being monitored by the desaturation protection circuit, the monitoring circuit 230 can sample (or latch) that same voltage, at an appropriate time to monitor health of the IGBT 220 as well.

At block 330, a digitally sampled voltage is transmitted to the processor 240, which is controlling the gate drive board 210, for recording/accumulating in the memory 250 as prognostic data and monitoring over time (as depicted by Lines C of FIG. 2). For instance, over time, the turn-on voltage can get higher (e.g., increase in magnitude over time) as wire bond fail and other aging effects.

At block 340, this digitally sampled voltage can now be used for prognostic monitoring. In accordance with one or more embodiments, another potential signal is the charge current needed to turn on the IGBT 220. The voltage across a gate drive resistor of the gate drive board 210, typically on the order of 1 to 2 ohms, can be monitored using an analog latch, inside the monitoring circuit 230, to detect the charge current. The voltage across the gate drive resistor can be monitored as well using an isolated ADC, such as a sigma-delta ADC and monitored by the micro-processor. This would provide prognostic data of a gate charge capacitance of the IGBT 220, which degrades with aging.

At block 350, the controller 205 can enable operation in a degraded mode or fail operational mode. Detecting and assessing the health of the IGBT or gate drive system allows tailoring the operational control to minimize further degradation of function by operating in a reduced output mode (degraded mode) or even in a fail operational mode whereby the unit can continue to deliver some level of output under certain conditions to maintain a level of functionality until the unit can be replaced for maintenance. At block 360, the central maintenance computer 260 can provide notifications to the user.

The technical effect and benefits of embodiments herein include monitoring a turn-on voltage and a charge current during operation of semi-conductor devices (e.g., IGBT). While recording these signals (e.g., the turn-on voltage and the charge current) over time, a monitoring circuit can be used to determine when a line replaceable unit (LRU) needs to be replaced before a failure occurs. The technical effect and benefits of embodiments herein also provides the hooks required to monitor aging effects of power modules, which can be used to determine when an LRU is approaching end of life.

The term "about" is intended to include the degree of error associated with measurement of the particular quantity based upon the equipment available at the time of filing the application.

The terminology used herein is for the purpose of describing particular embodiments only and is not intended to be limiting of the present disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, element components, and/or groups thereof.

While the present disclosure has been described with reference to an exemplary embodiment or embodiments, it will be understood by those skilled in the art that various changes may be made and equivalents may be substituted for elements thereof without departing from the scope of the present disclosure. In addition, many modifications may be made to adapt a particular situation or material to the teachings of the present disclosure without departing from the essential scope thereof. Therefore, it is intended that the present disclosure not be limited to the particular embodiment disclosed as the best mode contemplated for carrying out this present disclosure, but that the present disclosure will include all embodiments falling within the scope of the claims.

What is claimed is:

1. A system comprising:
    a semi-conductor device;
    a gate drive board providing a voltage to the semi-conductor device;
    a controller driving the voltage provided by the gate drive board; and
    a monitoring circuit coupled to the gate drive board to monitor operations of the controller and the semi-conductor device.

2. The system of claim 1, wherein the controller enables operations of the system in a degraded mode or fail operational mode based on one or more critical signals received by the monitoring circuit.

3. The system of claim 1, wherein the gate drive board provides a gateway to one or more critical signals that are used by the monitoring circuit to monitor the operations.

4. The system of claim 1, wherein the gate drive board turns on and off the semi-conductor device via the voltage.

5. The system of claim 1, wherein the monitoring circuit is coupled to the gate drive board to monitor operations of the controller and a charge current of the semi-conductor device.

6. The system of claim 1, wherein the monitoring circuit records the voltage with respect to the operations over time as prognostic data.

7. The system of claim 1, wherein the prognostic data comprise data for predicting time at which the system, the controller, or the semi-conductor device will fail.

8. The system of claim 1, wherein the system is in communication with a central maintenance computer that reports out data via notifications to other systems or users.

9. A method comprising:
    driving, by a controller connected to a gate drive board, a voltage of the gate drive board;
    providing, by the gate drive board, the voltage to a semi-conductor device; and
    monitoring, by a monitoring circuit coupled to the gate drive board, operations of the controller and the semi-conductor device.

10. The method of claim 9, wherein the controller enables operations of the system in a degraded mode or fail operational mode based on one or more critical signals received by the monitoring circuit.

11. The method of claim 9, wherein the gate drive board provides a gateway to one or more critical signals that are used by the monitoring circuit to monitor the operations.

12. The method of claim 9, wherein the gate drive board turns on and off the semi-conductor device via the voltage.

13. The method of claim 9, wherein the monitoring circuit is coupled to the gate drive board to monitor operations of the controller and a charge current of the semi-conductor device.

14. The method of claim 9, wherein the monitoring circuit records the voltage with respect to the operations over time as prognostic data.

15. The method of claim 9, wherein the prognostic data comprise data for predicting time at which the system, the controller, or the semi-conductor device will fail.

16. The method of claim 9, wherein the system is in communication with a central maintenance computer that reports out data via notifications to other systems or users.

* * * * *